United States Patent [19]

Domenico

[11] Patent Number: 4,618,024
[45] Date of Patent: Oct. 21, 1986

[54] MOVING SEISMIC SOURCE SYSTEM FOR USE IN WATER-COVERED AREAS

[75] Inventor: Samuel N. Domenico, Tulsa, Okla.
[73] Assignee: Amoco Corporation, Chicago, Ill.
[21] Appl. No.: 470,664
[22] Filed: Feb. 28, 1983
[51] Int. Cl.$^4$ .......................... G01V 1/04; H04R 1/02
[52] U.S. Cl. .................................. 181/120; 181/115; 367/141; 367/144
[58] Field of Search ........................ 367/15, 16, 21, 23, 367/49, 144, 145, 146, 153, 154, 141; 181/118, 111, 115, 116, 120

[56] References Cited

U.S. PATENT DOCUMENTS

| 2,586,706 | 2/1952 | Parr, Jr. ........................... 367/145 X |
| 2,604,954 | 7/1952 | Mann .................................... 181/115 |
| 2,877,859 | 3/1959 | Knudsen ............................ 181/115 |
| 2,954,090 | 9/1960 | Burg et al. ........................... 181/110 |
| 3,496,532 | 2/1970 | Thigpen ................................ 367/15 |
| 3,572,462 | 3/1971 | Gray .................................... 181/110 |
| 3,730,289 | 5/1973 | Barnard, IV ................... 367/145 X |

FOREIGN PATENT DOCUMENTS 1376513 12/1974 United Kingdom .................. 367/15

Primary Examiner—Charles T. Jordan
Assistant Examiner—Brian S. Steinberger
Attorney, Agent, or Firm—Timothy H. Briggs

[57] ABSTRACT

A moving seismic source system for the use in water-covered areas comprising a conventional source and streamer cable means with multiple receiver, and additionally includes between the source and receivers a volume of the body of water containing a small percentage of free gas to form a gas-water mixture. The volume of gas-water mixture is of select size and shape to form an interface with the gas-free water to form, for example, a paraboloid which acts to reflect and attenuate acoustic waves that impinge on the interface and so minimizes extraneous seismic noise.

4 Claims, 6 Drawing Figures

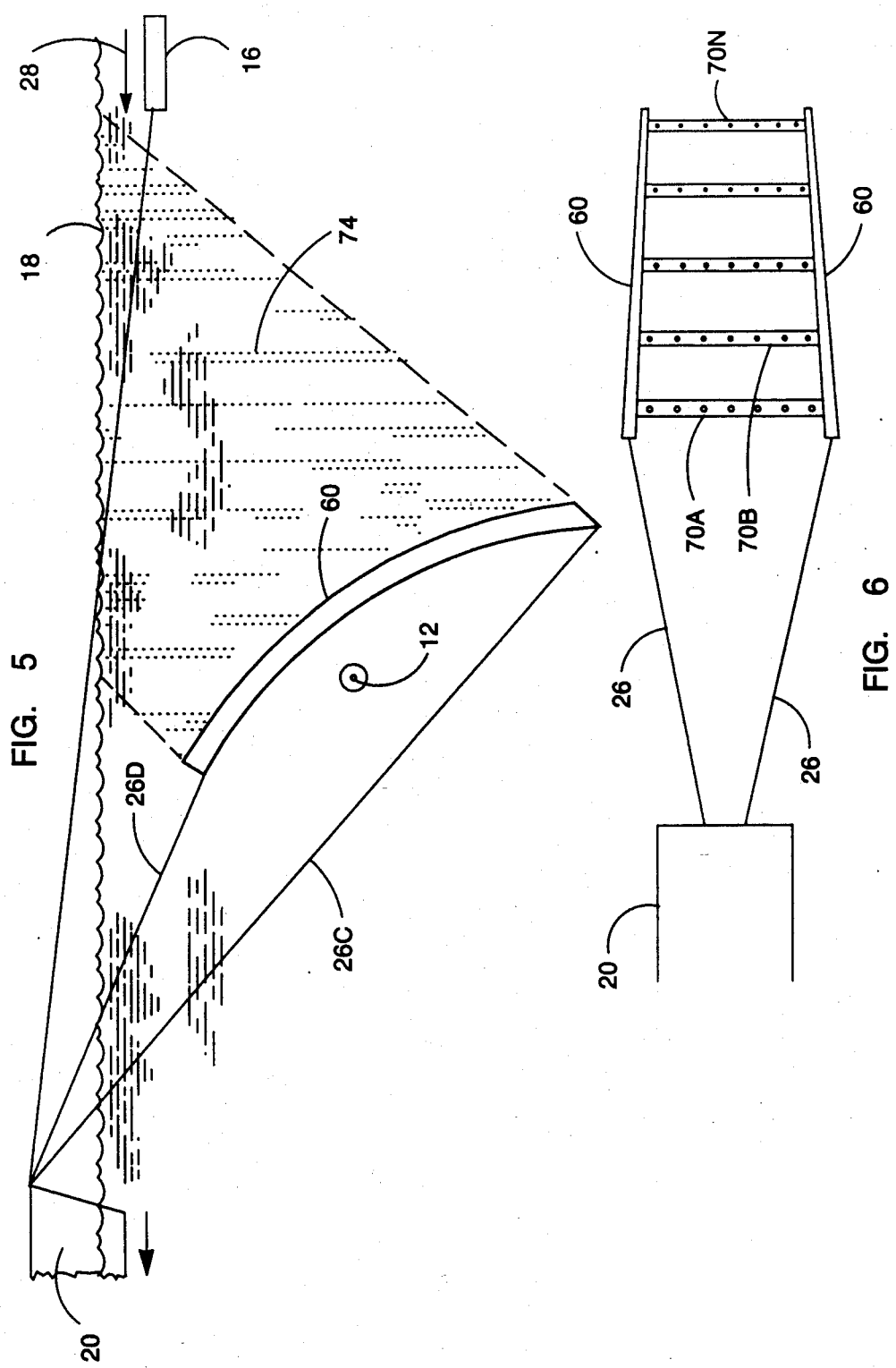

MOVING SEISMIC SOURCE SYSTEM FOR USE IN WATER-COVERED AREAS

CROSS REFERENCE TO RELATED APPLICATIONS

This invention is related to my copending application Ser. No. 1,470,665 filed on the same day as this application and entitled "Seismic Source System for Use in Water-Covered Areas."

BACKGROUND OF THE INVENTION

1. Field of Invention

This invention lies in the field of seismic sources for use in water-covered areas. More particularly, it concerns a type of moving seismic source system which can be used advantageously in offshore seismic prospecting, for recording seismic information with a minimum of seismic noise.

2. Description of the Prior Art

A common type of acoustic wave detector system used in water-covered areas comprises a single line of receptors or receivers (called a streamer cable) with the acoustic wave source positioned colinearly at a selected distance in front of the streamer. Acoustic wave energy moving upwardly and backwardly in the direction of the receivers causes formation of ghosts and horizontal waves which are recorded by the receivers and which tend to mask the useful seismic signals detected by the receivers.

SUMMARY OF THE INVENTION

It is a primary object of this invention to provide a moving seismic survey system for use in watercovered areas in which part of the wave energy from the source is reflected and attenuated by a portion of the water in which gas is injected to form a gas-water mixture of a selected shape which is maintained in a geometrical relationship to the source.

It is a further object of this invention to utilize both the reflection process and attenuation process to remove the seismic energy which would otherwise generate the noise.

It is a still further object of this invention to provide a means to maintain a gas-water mixture within the body of water and partially surrounding a moving seismic source by the injection of gas into the water at selected positions around the source and to move such gas-water mixture essentially in unison with the moving source system.

These and other objects are realized and the limitation of the prior art are largely overcome in this invention by means of a selected network of tubes or pipes which may be rigid or flexible; which have a plurality of small perforations; and which are submerged in the water and supplied with air under pressure, so as to inject columns of bubbles of gas into the water to provide the reflecting and absorbing volume of gas-water mixture.

While most of the gas-water mixture caused by the injection of the gas bubbles lies between the source and the streamer cable, some of the gas-water mixture must be positioned above the source to shield it from the surface. Thus, some of the gas is injected forward of the position of the source so that with the rising position of the bubbles as a function of time, there will be sufficient gas-water mixture by the source so as to minimize energy reaching the surface which produces ghost reflections.

An effective method of producing the gas-water mixture is by means of air bubbles. Thus, a network of pipes with numerous perforations that produce air bubbles at selected positions is used. One embodiment involves a sector of a paraboloid with the seismic source at the focus of the paraboloid which trails the moving source. An extension on the upper and leading portion of the paraboloid sector provides bubble emissions ahead of the axis of the paraboloid. In another embodiment, a single planar arrangement of pipes, or multiple separate planar arrangements can be used.

As the seismic source is shielded on the top and the back side by a gas-water mixture of selected three-dimensional shape, the upwardly, outwardly, and backwardly going waves are reflected downwardly. Thus, only a minimum of acoustic wave energy travels to the surface of the body of water to be reflected down as ghost reflections. Also a minimum of acoustic wave energy travels backwardly as a ghost wave within the water layer.

BRIEF DESCRIPTION OF DRAWINGS

These and other objects and advantages of this invention and a better understanding of the principles and details of the invention will be evident from the following description taken in conjunction with the appended drawings in which:

FIG. 5 illustrates another embodiment in which the structure which produces the stream of bubbles is a shell of a shape different from that of the other Figures.

FIG. 6 is a top view of the embodiment illustrated in FIG. 5.

DESCRIPTION OF THE PREFERRED EMBODIMENT

Figure 1:
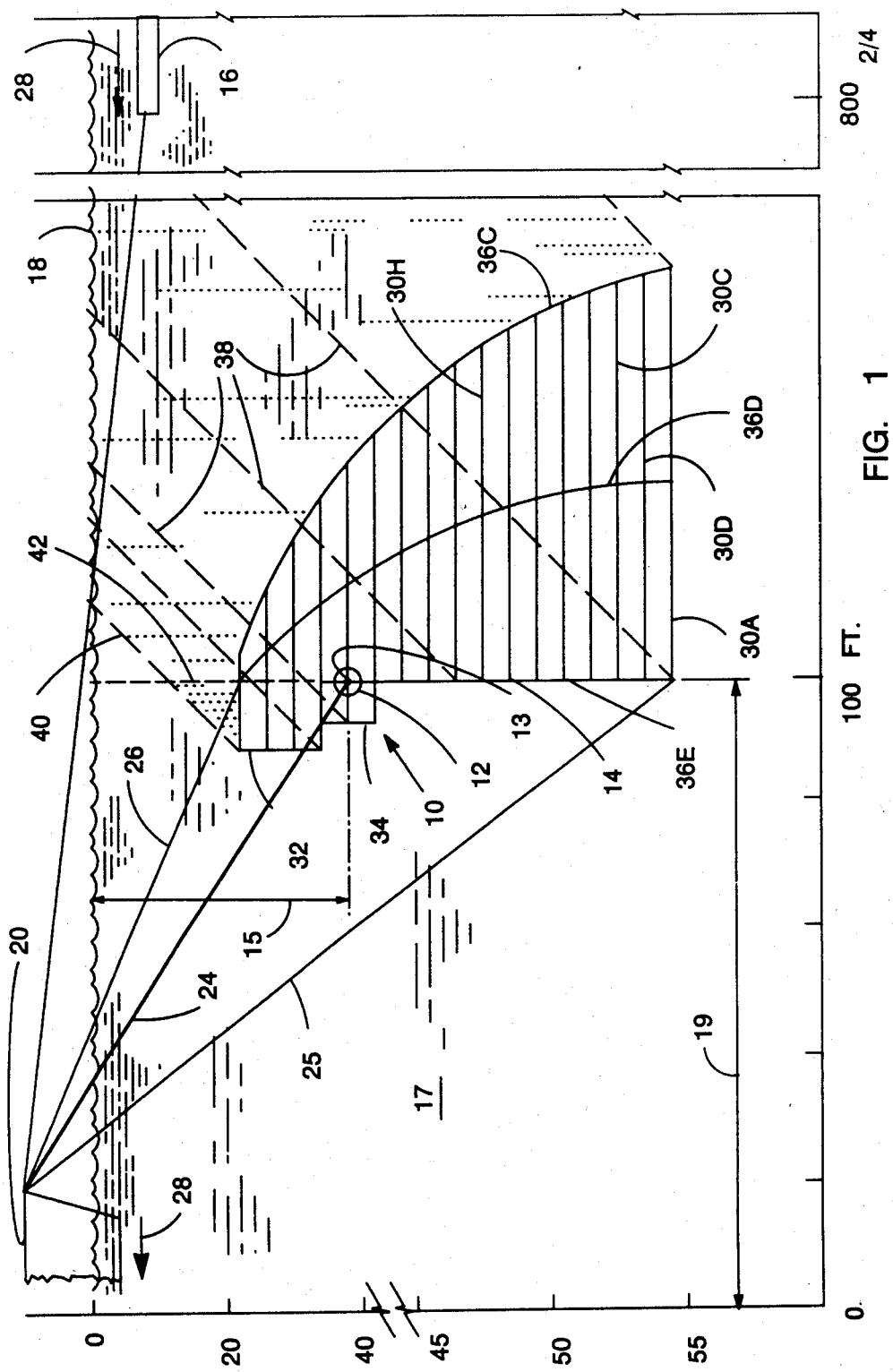
FIG. 1 illustrates schematically one embodiment of the invention including the survey boat, the seismic source, the gas-water mixture, and the seismic streamer.
Figure 2:
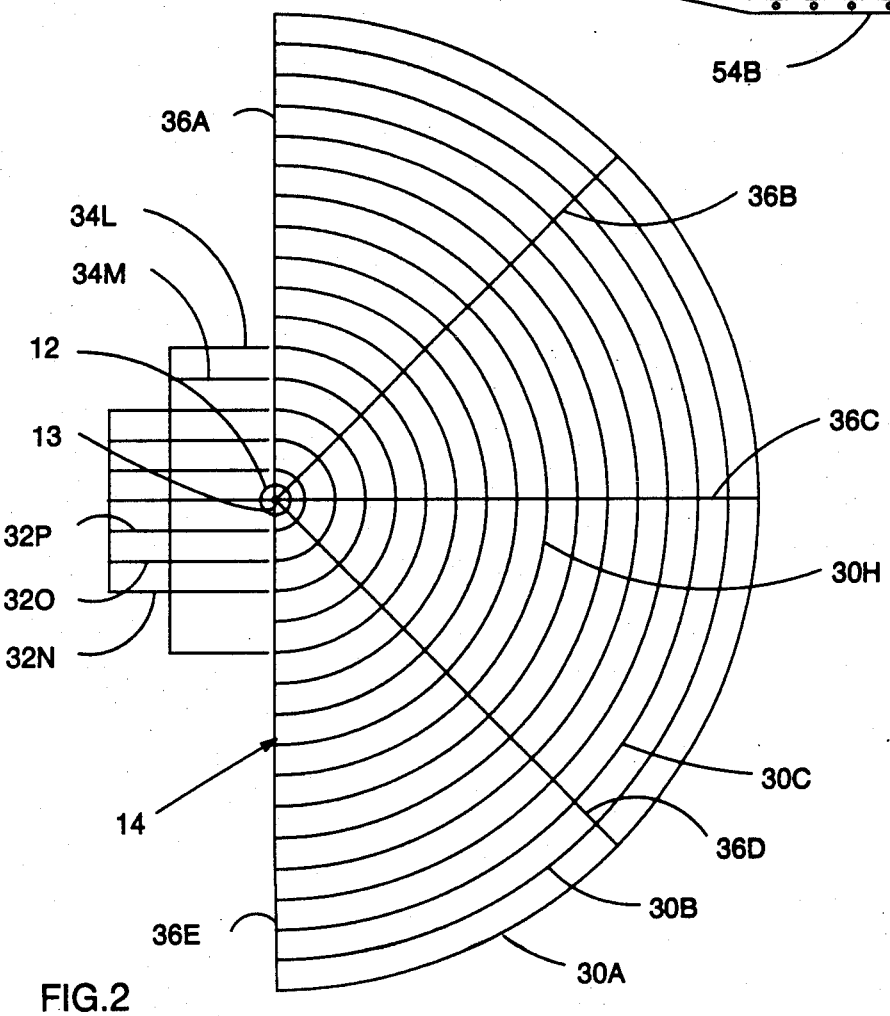
FIG. 2 illustrates in plan view, the structure which provides a gas-water mixture of FIG. 1.

Referring now to FIGS. 1 and 2 there is shown schematically, in elevation and plan view, a moving seismic source and receiving system which has been designed in accordance with this invention and is the preferred embodiment. A body of water 17 is shown having surface 18 and a seismic survey ship 20 on the surface moving in the direction of the arrow 28 at a selected speed. Conventionally, such survey ships generally travel at a speed of about 4 knots. At a selected distance 19, which may be in the order of 100 ft behind the ship 20, is positioned a seismic source 12 at a selected depth 15 which may be of the order of 40 ft. The source may be suspended from floats (not shown but well-known in the art) and towed by the ship 20 by connecting means which is shown schematically as the cable 24.

The oscillating bubble effect that accompanies the use of an explosive device or an air gun is an undesirable source of noise. This effect can be eliminated by use of a water gun which ejects water rather than compressed air, thereby eliminating the oscillating air bubble.

FIG. 2 shows a plan view of the structure 10 which generates the gas-water mixture that partially surrounds the source and occupies the space above the source. This type of structure is further generally illustrated in my copending application. Means for towing a structure such as structure 10 and source 12 at a selected depth in water behind the towing vessel are well known.

In this particular structure there are a plurality of circular segments 30 having perforations (shown for convenience as semicircles, although they may be narrower or wider circular sectors). These circular pipes are attached to other pipes 36A, 36B, 36C, 36D, 36E, for example, to maintain the proper three-dimensional structure and also to supply the circular pipes with a compressed gas such as air which would be delivered to the structure by means of an air hose associated with two cables 26 and air compressors on the ship 20. By making the pipes flexible, one can fold the structure when storing it on the ship.

In the particular embodiment illustrated, the top five semicircle sections of pipe are extended linearly as shown and indicated by numerals 32N, 30O, 32P, etc. There are also shorter frontal sections 34M, 34L, etc.

A vertical line 42 (FIG. 1) represents the axis of the paraboloid and the position 13 indicates a focal point which is the same point as the position of the seismic source 12.

The structure shown in FIG. 1 is moving in the direction of the arrows 28 while the bubbles are rising vertically. Thus, from the point of view of an observer on the structure 10, the gas bubbles formed by gas escaping through the perforations of pipes 30 would seem to be rising along sloping lines such as 38 and 40. It will be clear, therefore, that if there were no frontal extensions of pipe, there would be no bubbles directly above the source and therefore there would be no shielding against the generation of ghost reflections immediately above the source. Consequently, by using the frontal extensions 32 and 34, there are sufficient bubbles injected into the water to provide a thick enough layer of gas-water mixture to provide the attenuation needed for acoustic wave energy moving upwardly from the source.

The paraboloid structure is very important in my copending application, where, because of the static situation, downward reflection of seismic energy can be quite important to the recording of improved seismic records. In the structure 10 of FIG. 1 of this invention there is also some downward reflection of energy which firstly detracts from the amount that must be absorbed in the gas-water mixture above the paraboloid and secondly, provides additional downgoing energy which would be equivalent to a somewhat larger source.

The streamer cable 16 is shown schematically trailing from the ship 20, by support cables 22. The streamer cable is controlled by conventional means to lie at a selected depth of water. The front end of such a streamer cable 16 is positioned behind the ship at a distance of some 700–800 ft, and, therefore, for a given position all of the bubble energy from structure 10 would have arrived at the surface, and the gas and the gas-water mixture would be completely dispersed before the streamer cable 16 would reach such given position. Thus, the streamer is completely receptive to reflection energy arising from the lower geological interfaces, and is without ghost reflections or horizontally traveling seismic waves in the water layer.

Figure 3:
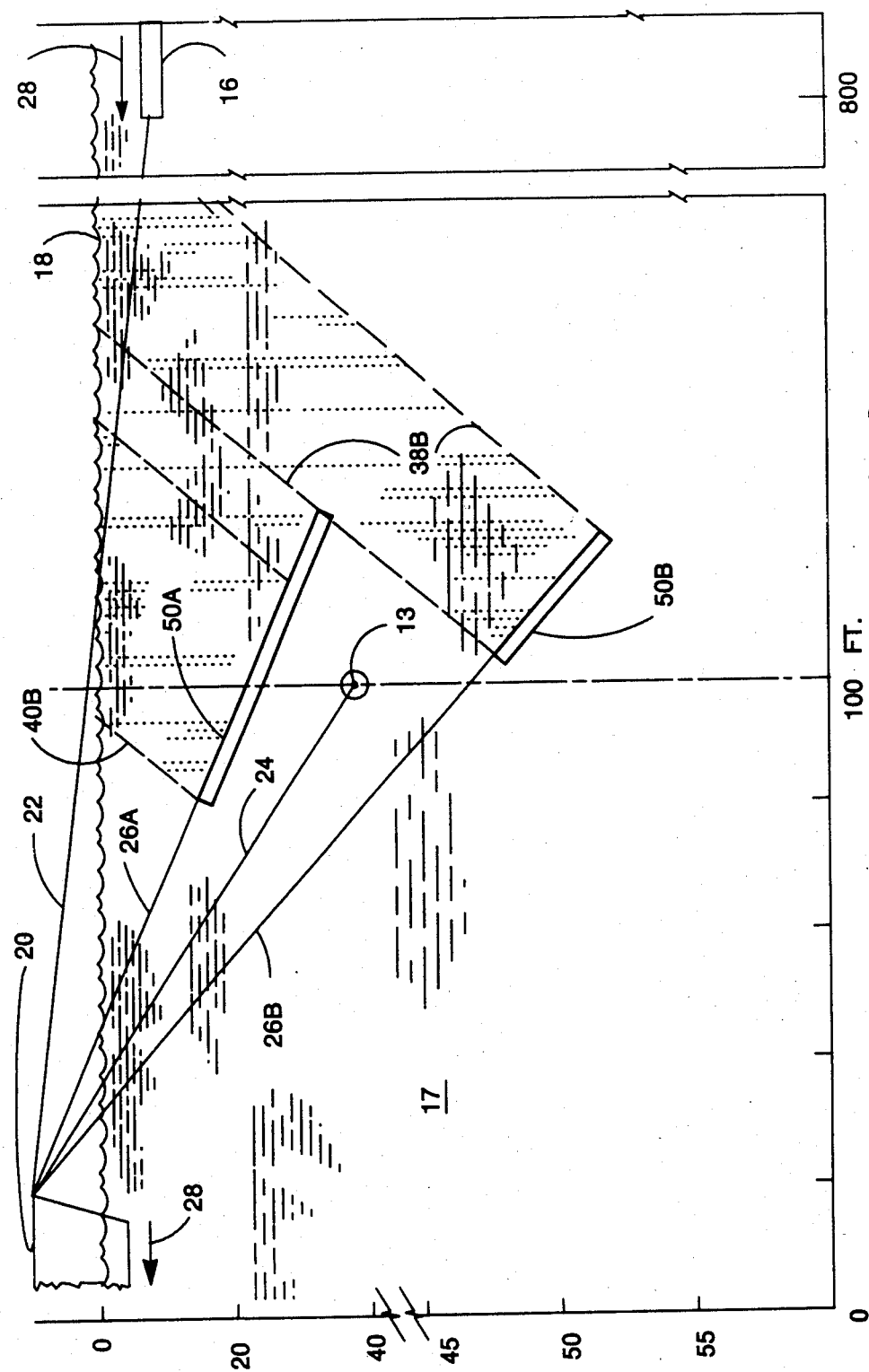
FIG. 3 illustrates a second embodiment in which the structure which produces streams of bubbles is one or more planar type systems rather than a partially circular system of pipes.

Referring now to FIG. 3 which is a schematic diagram similar to FIG. 1, but utilizing a different array of pipes and tubes having corresponding perforations which are supplied with pressurized gas through air hoses associated with tow lines 26A and 26B. The structures 50A and 50B will be described in terms of FIG. 4 but it can generally be said that they represent a planar perforated pipe grill structure designed to produce a plurality of rising columns of small bubbles to provide a blanket or shield of gas-water mixture above and behind the source 13. The same water gun source shown in FIG. 1 may be used in FIG. 3 and indicated by the numeral 12. The source, the ship and the streamers are all moving in the direction of the arrows 28. A set of short, dashed lines indicated as 38B and 40B are shown and which correspond to the lines 38 and 40 of FIG. 1. This would be the apparent angle of rise of the bubble for a selected speed of travel and size of bubble.

It is seen that the space above and behind the source 12 encompassed within the dashed lines provides a shield of gas-water mixture which serves not only to reflect energy from the interfaces between the gas-water mixture and the body of gas-free water but also serves to attenuate acoustic waves generated by the source 12 which passes through these interfaces, so as to minimize those waves which travel horizontally to the rear, outwardly and vertically to the surface, which would cause serious seismic noise.

Figure 4:
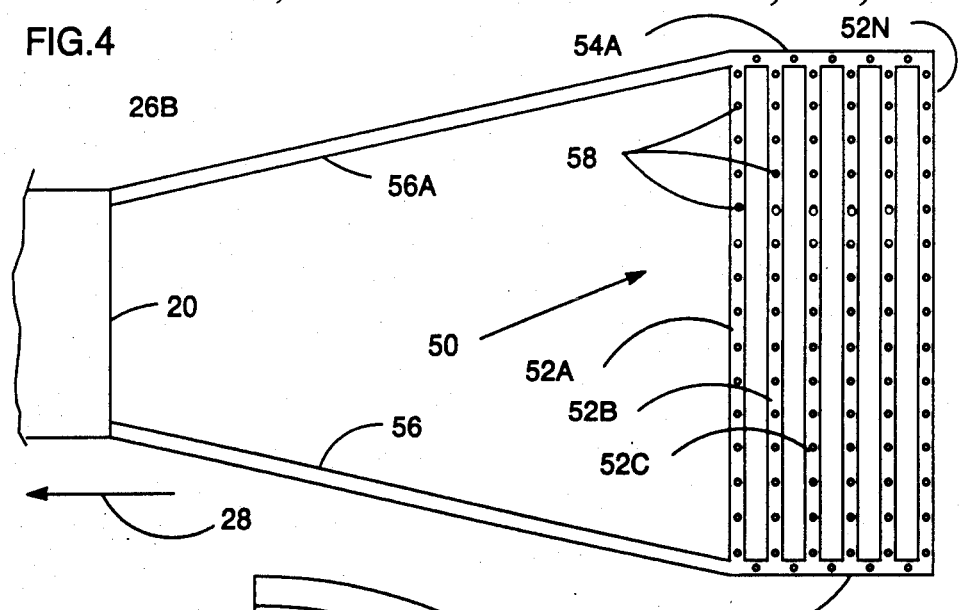
FIG. 4 illustrates a top view of one of the planar type systems of FIG. 3. This may be made of rigid pipe or may be made of flexible plastic pipe so that it can be handled more readily in the narrow confines of the usual seismic ship.

Referring now to FIG. 4, there is shown one configuration of planar systems 50A and 50B of FIG. 3. System 50A and system 50B would each include a series of horizontal parallel pipes 52A, 52B, and 52C . . . 52N. The ends of such parallel pipes are connected together by manifolds 54A and 54B. The tensile members that carry the structure forward with the ship are cables 56A and 56B which may be similar to cables 26A and 26B. The compressed gas is supplied by corresponding compressors or other compressed gas source on the ship 20 which could be conventional.

Referring to FIGS. 5 and 6, there is shown another embodiment of the means to produce the gas-water mixture. FIG. 5 represents a side view of a curved rectangular pipe structure, and FIG. 6 represents the top view of the embodiment of FIG. 5. There are shown curved end members, or pipes 60, which are connected by straight horizontal pipes 70A, 70B, . . . , 70N which have perforations 72 through which a gas such as air is injected into the water in bubble column 74 in a manner similar to that in the other embodiments. The shape of curved end members 60 is such as to get proper reflections of signals from source 12 so as to eliminate or greatly reduce ghost reflections from reaching the streamer cable.

The structures of FIGS. 1, 2, 3, and 4 which produce the gas-water mixture shield are shown as tubular members, rather than continuous, impervious sheets since the resistance to the movement of these structures through the water would be considerably less than for a large impervious sheet structure. In any event, the use of bubbles as done in this invention provides configurations insuring that there will be a supply of bubbles above the source at the time the source is activated.

Other shapes of pipe structure can be devised which would produce a volume or shield of gas-water mixture of suitable size and shape that could be moved in synchronism with the ship, source, and streamer cable.

Small percentages by volume of air or gas in water can be utilized to form the gas-water mixture. For example, percentages by volume of gas as low as 0.5% to 1% provides very large decreases in velocity and large increases in absorption of seismic energy and transmission through such gas-water mixtures. Concentration of gas can increase to essentially 100% if physically possible.

While this method can be used for any combination of liquid and gas mixture, it has been described in terms of air and water, solely for convenience, and not in the way of limitation.

While the invention has been described with a certain degree of particularity, it is manifest that many changes may be made in the details of construction and the arrangement of components without departing from the spirit and scope of this disclosure. It is understood that the invention is not limited to the exemplified embodiments set forth herein but is to be limited only by the scope of the attached claim or claims including a full range of equivalency to which each element thereof is entitled.

What is claimed is:

1. An apparatus which can easily be moved through water for both reflecting acoustic wave energy in a downward direction and attenuating upwardly and horizontally traveling acoustic wave energy produced by a seismic source used in a body of water wherein the seismic source and seismic sensor means are both moved substantially horizontally through a body of water comprising:
   gas releasing means interposed in the water between the seismic source and the seismic sensor means and between the seismic source and the surface of the water for releasing gas bubbles into the water wherein gas releasing means comprises a plurality of coaxial concentric pipes arranged vertically with spaces between adjacent pipes in the shape of at least a radial sector of a paraboloid, with a vertical axis of the paraboloid through the seismic source, each of said pipes having a plurality of perforations; and
   means to supply said pipes with pressurized gas.

2. The apparatus as defined in claim 1 in which the radial sector comprises 180° radial slice of the paraboloid.

3. The apparatus as defined in claim 1, including an extension means for extending the gas releasing means forward from the paraboloid sector.

4. A method for both reflecting acoustic wave energy in a downward direction and attenuating upwardly and horizontally traveling acoustic wave energy produced by a seismic source used in a body of water wherein the seismic source and seismic sensor means are both moved substantially horizontally through a body of water comprising:
   interposing a gas releasing means in the water between the seismic source an the seismic sensor means and between the seismic source and the surface of the water for releasing gas bubbles into the water wherein the shielding gas releasing means comprises a plurality of coaxial concentric pipes arranged vertically with spaces between adjacent pipes in the shape of at least a radial sector of a paraboloid, with the vertical axis of the paraboloid through the seismic source, each of said pipes having a plurality of perforations, and means to supply such pipes with pressurized gas; and
   supplying gas to said means to supply said pipes with pressurized gas.

* * * * *